United States Patent [19]
Hamada

[11] Patent Number: 5,635,829
[45] Date of Patent: Jun. 3, 1997

[54] OPTICAL SENSOR

[75] Inventor: Hidenobu Hamada, Amagasaki, Japan

[73] Assignee: Matsushita Electric Industrial Co., Ltd., Kadoma, Japan

[21] Appl. No.: 513,719

[22] Filed: Aug. 11, 1995

[30] Foreign Application Priority Data

Aug. 12, 1994 [JP] Japan ................... 6-190281

[51] Int. Cl.$^6$ ................... G01R 33/032; G01R 19/00
[52] U.S. Cl. ................... 324/96; 324/117 R
[58] Field of Search ................... 324/96, 117 R, 324/244.1, 750, 752, 753; 250/231.1, 227.21; 356/365; 359/257

[56] References Cited

U.S. PATENT DOCUMENTS

| | | |
|---|---|---|
| 4,079,429 | 3/1978 | Travot et al. . |
| 5,477,134 | 12/1995 | Hamada ................... 324/96 |

FOREIGN PATENT DOCUMENTS

| | | |
|---|---|---|
| 0 599 181 | 6/1994 | European Pat. Off. . |
| 4205509 | 8/1993 | Germany . |
| 62-150170 | 7/1987 | Japan . |
| 6-207858 | 7/1994 | Japan ................... 324/96 |
| 6-207954 | 7/1994 | Japan ................... 324/96 |
| 7-140181 | 6/1995 | Japan ................... 324/96 |

OTHER PUBLICATIONS

A. Jaecklin et al., "Measuring Current at Extra–High Voltage", LASER FOCUS, vol. 6, No. 5, pp. 35–38, May 1970.
A. Smith et al., "Noise Reduction In Optical Measurement Systems", Proceedings of the Institution of Electrical Engineers, vol. 125, No. 10, pp. 935–941, Oct. 1978 European Search Report dated Jan. 17, 1997.

*Primary Examiner*—Ernest F. Karlsen
*Attorney, Agent, or Firm*—Ratner & Prestia

[57] ABSTRACT

In an optical unit (a), a first polarizer, a first light wave phase modulator (a Pockels device), a second light wave phase modulator, and a second polarizer are arranged in this sequence. A voltage to be measured is applied to the first light wave phase modulator. A control modulation voltage which has a frequency higher than that of the voltage to be measured is applied to the second light wave phase modulator. A signal processing unit (b) consists of: an O/E converter which converts the intensity of light output from the optical unit (a) into an electric signal; a phase shifter which shifts the phase of the control modulation voltage applied to the second light wave phase modulator by $\pi/2$ radians; an adder 16 which adds an output of the O/E converter 17 to that of the phase shifter 15; and a demodulator c which demodulates output of the adder 16.

25 Claims, 13 Drawing Sheets

1: MODULATION SIGNAL (1kHz)
2: ADDITION SIGNAL (INTEGRATION OF SIGNAL 1)
3: SENSOR SIGNAL
4: CIRCUIT INPUT SIGNAL (SIGNAL 2+3)

$V_m = 252$ [V], $M_0 = 0.126$ [rad], $f_m = 1$ [kHz]
$V_s = 60$ [V], $S_0 = 0.030$ [rad], $f_s = 50$ [Hz]

1: CIRCUIT INPUT SIGNAL
2: COMPARATOR OUTPUT
3: F/V CONVERTER OUTPUT
4: LPF OUTPUT

OPTICAL SENSOR

BACKGROUND OF THE INVENTION

1. Field of Industrial Utility

The invention relates to an optical sensor which can function such as a voltage sensor or a current sensor that can be used as an optical PT (potential transformer), an optical CT (current transformer), or the like for detecting the voltage to ground, the line current, or the like of a distribution line.

2. Related Art of the Invention

Conventionally, for example, a known voltage sensor of the intensity modulation type has the following configuration. As shown in FIG. 8, a first polarizer 47 having a set angle of $\pi/2$ radians, a quarter-wave plate 48, a Pockels device 49, and a second polarizer 52 having a set angle of $\pi/2$ radians are arranged on an optical axis in this sequence from the light entrance side. A voltage to be measured 51 is applied to the Pockels device 49. The reference numeral 50 designates electrodes of the Pockels device 49.

Nonpolarized incident light 53 is converted into linearly polarized light 54 by the first polarizer 47, and further converted into circularly polarized light 55 by the quarter-wave plate 48. The reference numeral 56 designates a polarization state of light which is changed by the voltage to be measured 51 applied to the Pockels device 49 and output therefrom. The change in intensity of light 57 output from the second polarizer 52 corresponds to the polarization state 56 of output light of the Pockels device 49 which changes depending on the voltage to be measured 51. Consequently, the voltage to be measured 51 can be detected by monitoring the modulation depth (degree of modulation) of the intensity of output light of the second polarizer 52.

The modulation depth (degree of modulation) of the intensity of light means a ratio of the AC component of the intensity of light and the DC component of the intensity of light.

For example, a prior art current sensor of the intensity modulation type has the following configuration. As shown in FIG. 9, a first polarizer 58 having a set angle of $\pi/2$ radians, a Faraday device 60, and a second polarizer 59 having a set angle of $\pi/4$ radians are arranged on the optical axis in this sequence from the light entrance side. A magnetic field 65 generated by the current to be measured is applied to the Faraday device 60.

Nonpolarized incident light 53 is converted into linearly polarized light 54 by the first polarizer 58, and further converted by the Faraday device 60 into linearly polarized light 62 which is changed by Faraday rotation angle ($\theta$) 61 in accordance with the magnetic field 65 to be measured. The magnetic field 65 to be measured is a physical dimension corresponding to the current to be measured. The change in intensity of output light 63 of the second polarizer 59 corresponds to the polarization state (a change in polarizing angle of the linearly polarized light) of output light 62 of the Faraday device 60 which changes depending on the magnetic field 65. Consequently, the current to be measured can be detected by monitoring the modulation depth (degree of modulation) of the intensity of output light 63 of second polarizer 59.

However in either of the above-described optical sensors, in addition to an intensity changing which corresponds to the changing of the voltage or current to be measured a slow change in intensity of light is produced in said light output. Thus the AC component of the intensity of light output is distorted, because of the reason such as a change in coupling loss of the optical components, or a change in intensity of incident light which is caused by the external environment (for example, cloud or condensation on glass, displacement of the optical axis due to vibration, or generation of stress caused by a shake of an optical fiber). When the frequency of the voltage or current to be measured in the vicinity of DC, particularly, it is impossible to distinguish the AC component due to the voltage or current to be measured from that due to a physical dimension other than the voltage or current to be measured, resulting in that the voltage or current cannot correctly be measured. This is caused by the fact that both the optical sensors conduct AM modulation (amplitude modulation).

SUMMARY OF THE INVENTION

It is an object of the invention to provide an optical sensor (a voltage sensor or a current sensor) which can eliminate the above-discussed defectives of a prior art optical sensor and can conduct measurements ranging from a DC measurement to a high frequency measurement without being affected by the external environment.

An optical sensor of the present invention comprises an optical unit and a signal processing unit, wherein said optical unit has on an optical axis;

a first polarizer which is arranged at a light input side, a second polarizer which is arranged at a light output side, the polarization direction of which is substantially parallel or perpendicular to that of said first polarizer, a first light wave phase modulator which are arranged between the first and second polarizers, for phase-modulating light wave according to physical dimension to be measured, a second light wave phase modulator which are arranged between the first and second polarizers, for phase-modulating light wave according to a control modulation physical dimension which has higher frequency of that of the physical dimension to be measured, and said first and second light wave phase modulators being arranged in a manner that directions of light wave phase modulation in said modulators are parallel or perpendicular to each other, and said signal processing unit has;

an O/E converter which converts intensity of light of said optical unit into an electric signal, a phase shifter which shifts a phase of said control modulation physical dimension applied to said second light wave phase modulator by $\pi \times n \pm \pi/2$ radians (n: an integer), an adder which adds an output of said O/E converter to an output of said phase shifter, and a demodulator which demodulates an output of said adder.

An optical sensor of the present invention comprises an optical unit and a signal processing unit, wherein said optical unit has on an optical axis;

a first polarizer which is arranged at a light input side, a second polarizer which is arranged at a light output side, the polarization direction of which is substantially parallel or perpendicular to that of said first polarizer, a first light wave phase modulator which are arranged between the first and second polarizers, for phase-modulating light wave according to a value which is obtained by time-integrating a physical dimension to be measured, a second light wave phase modulator which are arranged between the first and second polarizers, for phase-modulating light wave according to a control modulation physical dimension which has higher frequency of that of the physical dimension to be measured, and said first and second light wave phase modulators being arranged in a manner that directions of light wave phase modulation in said modulators are parallel or perpendicular to each other, and said signal processing unit has;

an O/E converter which converts intensity of light of said optical unit into an electric signal, a phase shifter which shifts a phase of said control modulation physical dimension applied to said second light wave phase modulator by $\pi \times n \pm \pi/2$ radians (n: an integer), an adder which adds an output of said O/E converter to an output of said phase shifter, and a demodulator which demodulates an output of said adder.

In the optical sensor set forth in claim 1, the intensity of output light of the optical sensor is subjected to PM modulation by the physical dimension to be measured (a voltage or current to be measured). Therefore, the information of the physical dimension to be measured is carried on the time axis of the change in output of the optical sensor. This establishes orthogonal relationships between the information and that of the external environment which is carried on the intensity axis of the change in output of the optical sensor. As a result, the information of the physical dimension to be measured is not affected by the external environment so that the information of the physical dimension to be measured which ranges from DC to a high frequency can correctly be detected.

In the optical sensor set forth in claim 2, the intensity of output light of the optical sensor is subjected to FM modulation by the physical dimension to be measured. In the same manner as the case of claim 1, therefore, the information of the physical dimension to be measured is carried on the time axis of the change in output of the optical sensor so as to establish orthogonal relationships between the information and that of the external environment which is carried on the intensity axis. As a result, the information of the physical dimension to be measured is not affected by the external environment so that the information of the physical dimension to be measured which ranges from DC to a high frequency can correctly be detected.

In the optical sensor set forth in claim 3, even when the physical dimension to be measured is remotely located, or when the components can not be arranged on the same optical axis, it is possible to attain the same functions as those described above.

As set forth in claim 4, when at least one of the first and second light wave phase modulators has a plurality of light wave phase modulating means, it is possible to attain the same functions as those described above.

As set forth in claim 5, the configuration can be simple and realized with low cost.

In the optical sensor set forth in claim 6, the voltage to ground of an electric wire to be measured can correctly be measured in the range of DC to a high frequency irrespective of environment influence.

In the optical sensor set forth in claim 7, the line current of an electric wire to be measured can correctly be measured in the range of DC to a high frequency without being affected by the external environment.

In the optical sensor set forth in claim 8, the voltage to ground and line current of an electric wire to be measured can be measured correctly and simultaneously in the range of DC to a high frequency without being affected by the external environment.

As described above the present invention has such merits that the physical dimension from DC to a high frequency without being affected by the external environment.

Figure 1:
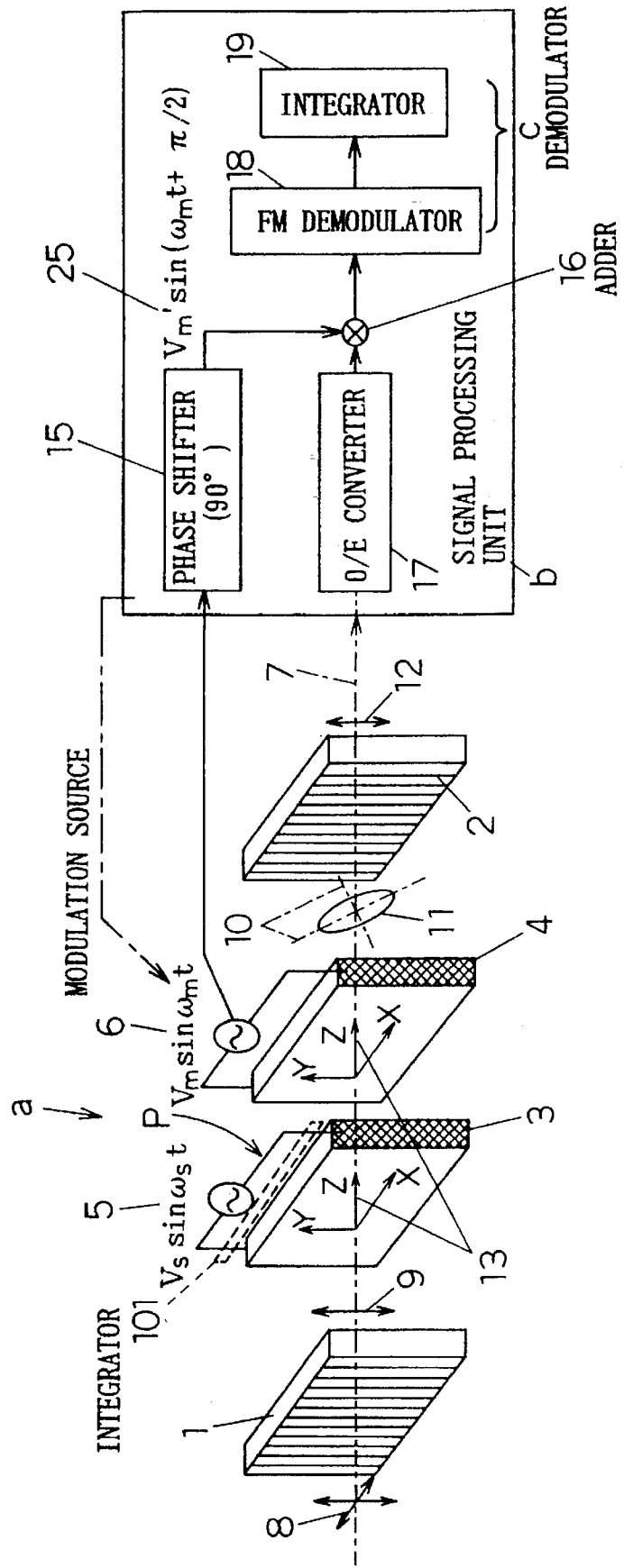
FIG. 1 is a diagram of a voltage sensor of the PM modulation type which is a first embodiment of the invention.

LEGEND OF REFERENCE NUMERALS a optical unit
b signal processing unit
c demodulator
d auxiliary unit
1 first polarizer
2 second polarizer
3 detection Pockels device
4 modulation Pockels device
5 voltage to be measured
6 control modulation voltage
7 optical axis
8 nonpolarized incident light
9 linearly polarized light output from a first polarizer
10 direction of the principal axis
11 elliptically polarized light output from a second polarizer
12 linearly polarized light output from an optical unit
13 crystal axes of Pockels devices
15 phase shifter
16 adder
17 O/E converter
18 FM demodulator 19 integrator
20 detection Faraday device
21 modulation Faraday device
22 current to be measured
23 control modulation current
24 voltage synchronized with a control modulation current
25 output of a phase shifter
26 coil for generating a magnetic field for a detection Faraday device
27 coil for generating a magnetic field for a modulation Faraday device
28 spectrum of an additional signal
29 low frequency side-band
30 high frequency side-band
31 pseudo PM modulation portion to be utilized
32 potential divider
34 oscillator for a voltage sensor
36 electric wire to be measured
37 line current
38 voltage to ground
39 attachment case
40 core for a CT
41 ground
42 floating earth capacity
43 coil for generating a detection magnetic field for a current sensor
44 oscillator for a current sensor PREFERRED EMBODIMENTS will be described with reference to the accompanying drawings.

FIRST EMBODIMENT

FIG. 1 shows a voltage sensor of the PM modulation type which is a first embodiment of the optical sensor of the invention. The voltage sensor comprises an optical unit (a) and a signal processing unit (b).

The optical unit (a) comprises: a first polarizer 1 having a set angle of $\pi/2$ radians; a first Pockels device (detection Pockels device) 3 in which the principal axis has a set angle of $\pi/4$ radians; a second Pockels device (modulation Pockels device) 4 in which the principal axis is parallel or perpendicular to that of the first Pockels device 3; and a second polarizer 2 having a set angle of $\pi/2$ radians. These components are arranged on the optical axis 7 in this sequence from the light entrance side. The detection Pockels device 3 and the modulation Pockels device 4 are provided with an electrode pair for detection voltage, and that for modulation voltage, respectively, so that parallel electric fields are generated in the direction of 0 radian. A voltage to be measured (Vs*sin($\omega_s$t)) 5 is applied to the detection Pockels device 3, and a control modulation voltage (Vm*sin($\omega_m$t)) 6 which is higher in frequency than the voltage to be measured is applied to the modulation Pockels device 4. For example when the physical dimension to be measured is power (commercial) frequency, the control modulation voltage is about 1 kHz frequency. The control modulation voltage is supplied from the below mentioned signal processing unit (b) as the chain line in FIG. 1. Here the detection Pockels device 3 forms the first light wave phase modulator of the present invention and the modulation Pockels device 4 forms the second light wave phase modulator.

On the other hand, the signal processing unit (b) comprises: an O/E converter 17 which converts the intensity of light output from the optical unit (a) into an electric signal; a phase shifter 15 which shifts the phase of a change of the control modulation voltage 6 applied to the modulation Pockels device 4 by $\pi/2$ radians (generally, $\pi \times n \pm \pi/2$ radians (n: an integer)), and which can adjust also the gain (the output voltage of the phase shifter is (Vm'*sin($\omega_m$t)+$\pi/2$)); an adder 16 which adds an output of the O/E converter 17 to that of the phase shifter 15; and a demodulator c which demodulates a change of the voltage to be measured on the basis of a change in phase of an output of the adder 16. In the demodulator c, generally, an FM demodulator 18 and an integrator 19 are used as shown in FIG. 1 (in some cases, however, the integrator is not used as described later). For example, the detection Pockels device 3 and the modulation Pockels device 4 may be made of $LiNbO_3$ or the like. Hereinafter, $LiNbO_3$ is abbreviated as LN.

Figure 2:
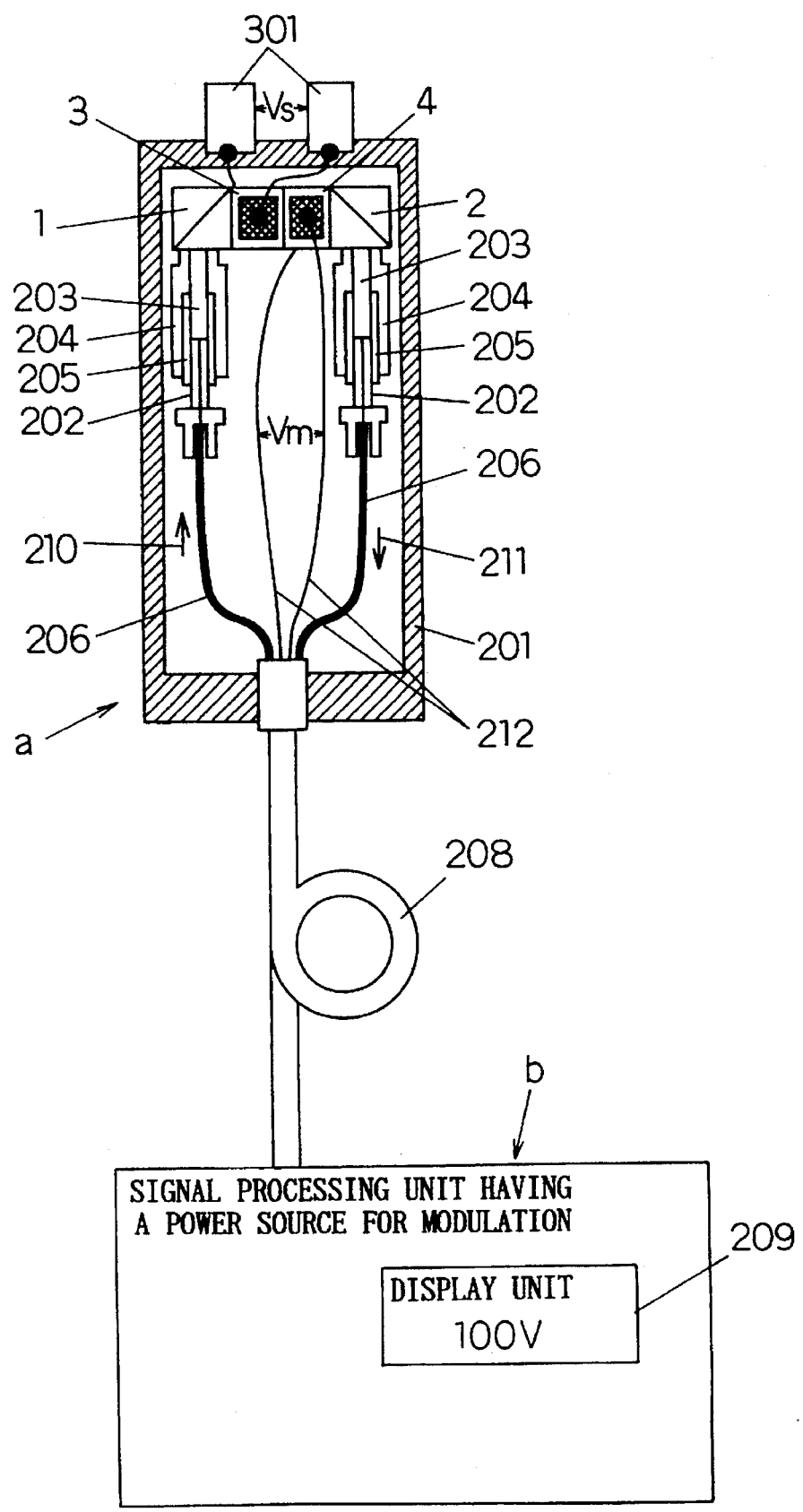
FIG. 2 shows an example of a product of the first embodiment.

FIG. 2 shows an example of a product of the first embodiment. In FIG. 2 the optical sensor is divided into two parts of optical unit and signal processing unit including a built-in electric source for modulation. They are connected by optical fiber cable 208 having built-in electric wire.

In the optical unit (a) a lens 203 for receiving light from a optical fiber 206, polarized light beam splitter 1 as the first polarizer (hereinafter which is abbreviated as PBS), $LiNbO_3$ crystal 3 for detection as the first light wave phase modulation device, $LiNbO_3$ crystal 4 for modulation as the second light wave phase modulation device, a PBS 2 as the second polarizer, and a lens 203 for outputting output light 211 to an optical fiber 206 are disposed on an optical axis and further they are built-in a case 201 having weather resistance. The voltage to be measured Vs is applied to the $LiNbO_3$ crystal 3 for detection via an electrode 301 exposed outside of the case 201 and the control modulation voltage Vm applied to the $LiNbO_3$ crystal 4 for modulation via a wire 212 from the signal processing unit (b). Here 202 indicates a ferrule, 204 indicates a lens holder and 205 indicates a split sleeve.

The signal processing unit (b) has same constitution as that of FIG. 1 fundamentally but a source for generating control modulation voltage is built-in and further a display for displaying the detected results is provided.

When a Pockels device made of LN or the like is used in the transverse modulation system where electrodes are formed at such surfaces which are parallel with the optical axis, as in the case of the first embodiment, and when LN crystals having same constitution are used for the first and second light wave phase modulation device, the LN crystal can have either of 6 kinds of configurations listed in Table 1 below. In each of the 6 kinds of configurations, the set directions of the first and second polarizers 1 and 2 are determined as listed in Table 2 below.

TABLE 1

| (1) Combinations of LN in transverse modulation system | | | | |
|---|---|---|---|---|
| Propagation direction | Cut direction | Electric field direction | | |
| | | X | Y | Z |
| X | Y, Z | — | (5) | (6) |
| Y | Z, X | (1) | — | (4) |
| Z | X, Y | (2) | (3) | — |

(The set angles of the first and second polarizers are fixed.

(The set angles of the first and second polarizers are fixed.

TABLE 2

| (1) Set directions of first and second polarizers in configurations of voltage sensor | | | | | | |
|---|---|---|---|---|---|---|
| | Combination numbers of configurations of voltage sensor | | | | | |
| | (1) | (2) | (3) | (4) | (5) | (6) |
| Direction of principal axis Set angles of polarizers | $n\pi/2 + \pi/4$ | $n\pi/2 + \pi/4$ | $n\pi/2$ | $n\pi/2$ | * | $n\pi/2$ |
| First | $n_1\pi/2$ | $n_1\pi/2$ | $n_1\pi/2 + \pi/4$ | $n_1\pi/2 + \pi/4$ | $n_1\pi/2$ | $n_1\pi/2 + \pi/4$ |
| Second | $n_2\pi/2$ | $n_2\pi/2$ | $n_2\pi/2 + \pi/4$ | $n_2\pi/2 + \pi/4$ | $n_2\pi/2$ | $n_2\pi/2 + \pi/4$ |
| Necessity of phase compensation | Necessary | Unnecessary | Unnecessary | Necessary | Necessary | Necessary |

(In the table, $n_1$, $n_2$, and $n_3$ are integers. The case of * is complicated and hence there is substantially no possibility of actually employing the case.)

SECOND EMBODIMENT

Figure 3:
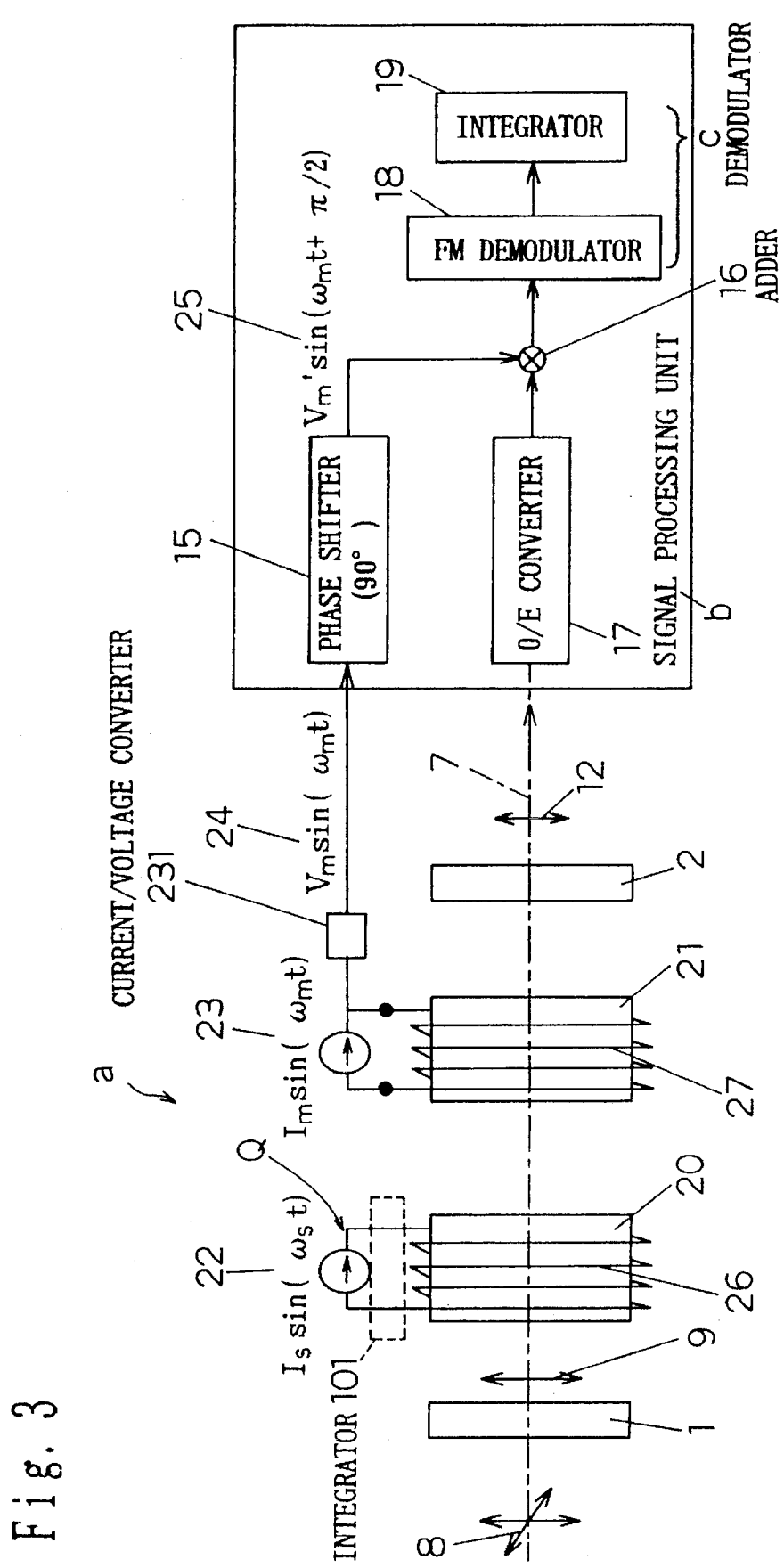
FIG. 3 is a diagram of a current sensor of the PM modulation type which is a second embodiment of the invention.

FIG. 3 shows of a current sensor of the PM modulation type which is a second embodiment the optical sensor of the invention. The current sensor also comprises an optical unit (a) and a signal processing unit (b).

The optical unit (a) comprises: a first polarizer 1 having a set angle of $\pi/2$ radians; a first Faraday device (detection Faraday device) 20; a second Faraday device (modulation Faraday device) 21; and a second polarizer 2 which is set to be parallel or perpendicular to the first polarizer 1. These components are arranged on the optical axis 7 in this sequence from the light entrance side. The detection Faraday device 20 and the modulation Faraday device 21 are provided with a coil for detection current 26 and a coil for modulation current 27, respectively, so that a magnetic field is generated in substantially parallel with the optical axis. A current to be measured ($Is*\sin(\omega_s t)$) 22 is applied to the detection Faraday device 20, and a control modulation current ($Im*\sin(\omega_m t)$) 23 which is higher in frequency than the current to be measured is applied to the modulation Faraday device 21.

On the other hand, the signal processing unit (b) comprises: an O/E converter 17 which converts the intensity of light output from the optical unit (a) into an electric signal; a phase shifter 15 which shifts the phase of a voltage ($Vm*\sin(\omega_m t)$) 24 that is synchronized with the control modulation current 23 applied to the modulation Faraday device 21, by $\pi/2$ radians (generally, $\pi \times n \pm \pi/2$ radians (n: an integer)), and which can adjust also the gain (the output voltage of the phase shifter is ($Vm'*\sin(\omega_m t+\pi/2)$); an adder 16 which adds an output of the O/E converter 17 to that of the phase shifter 15; and a demodulator c which demodulates a change of the current to be measured on the basis of a change in phase of an output of the adder 16. In the demodulator c, generally, an FM demodulator 18 and an integrator 19 are used as shown in FIG. 3 (in some cases, however, the integrator is not used as described later). Here the detection Faraday device 20 forms the first light wave phase modulation device of the present invention and the modulation Faraday device 21 forms the second light wave phase modulation device of the present invention. For example, the detection Faraday device 20 and the modulation Faraday device 21 may be made of garnet or the like.

Next, the operation will be described. In the voltage sensor of the first embodiment and the current sensor of the second embodiment, the light wave phase modulators of the optical unit (a) are different in type (Pockels devices and Faraday devices) and light waves behave in different manners, but the operation of the signal processing unit (b) is identical.

The operation of the optical unit (a) of the voltage sensor of the first embodiment will be described. In FIG. 1, nonpolarized incident light 8 is converted into linearly polarized light 9 by the first polarizer 1. After passing through the detection Pockels device 3, the light is further converted into elliptically polarized light corresponding to the induced birefringence (herein after this word is abridged as a phase difference angle) $\theta s$ ($=So*\sin(\omega_s t)$, here So is proportional to the Vs) of the detection Pockels device 3. After passing through the modulation Pockels device 4, the light is further converted into elliptically polarized light 11 which corresponds to a total phase difference angle of $\theta s+\theta m$ which is a sum of the phase difference angle $\theta m$ ($=Mo*\sin(\omega_m t)$, here Mo is proportional to the Vm) due to the modulation Pockels device 4 and the phase difference angle $\theta s$ due to the detection Pockels device 3. Since the phase difference angle $\theta s$, $\theta m$ vibrates respectively with angular velocity $\omega_s, \omega_m$ and maximum amplitude So,Mo, the elliptically polarized light 11 is such elliptically polarized light that vibrates in response to them. The reference numeral 10 designates the direction of the principal axis, and 13 designates the crystal axes of the Pockels devices. Therefore the linearly polarized light 12 which has passed through the second polarizer 2 shows a change in intensity of $\{\cos(\theta m+\theta s)+1\}/2$ with respect to the intensity of incident light, since whole input/output characteristics for the first polarizer 1, detection Pockels device 3, the modulation Pockels device 4, the second polarizer 2 is $\{\cos(\theta m+\theta s)+1\}$.

Figure 11:
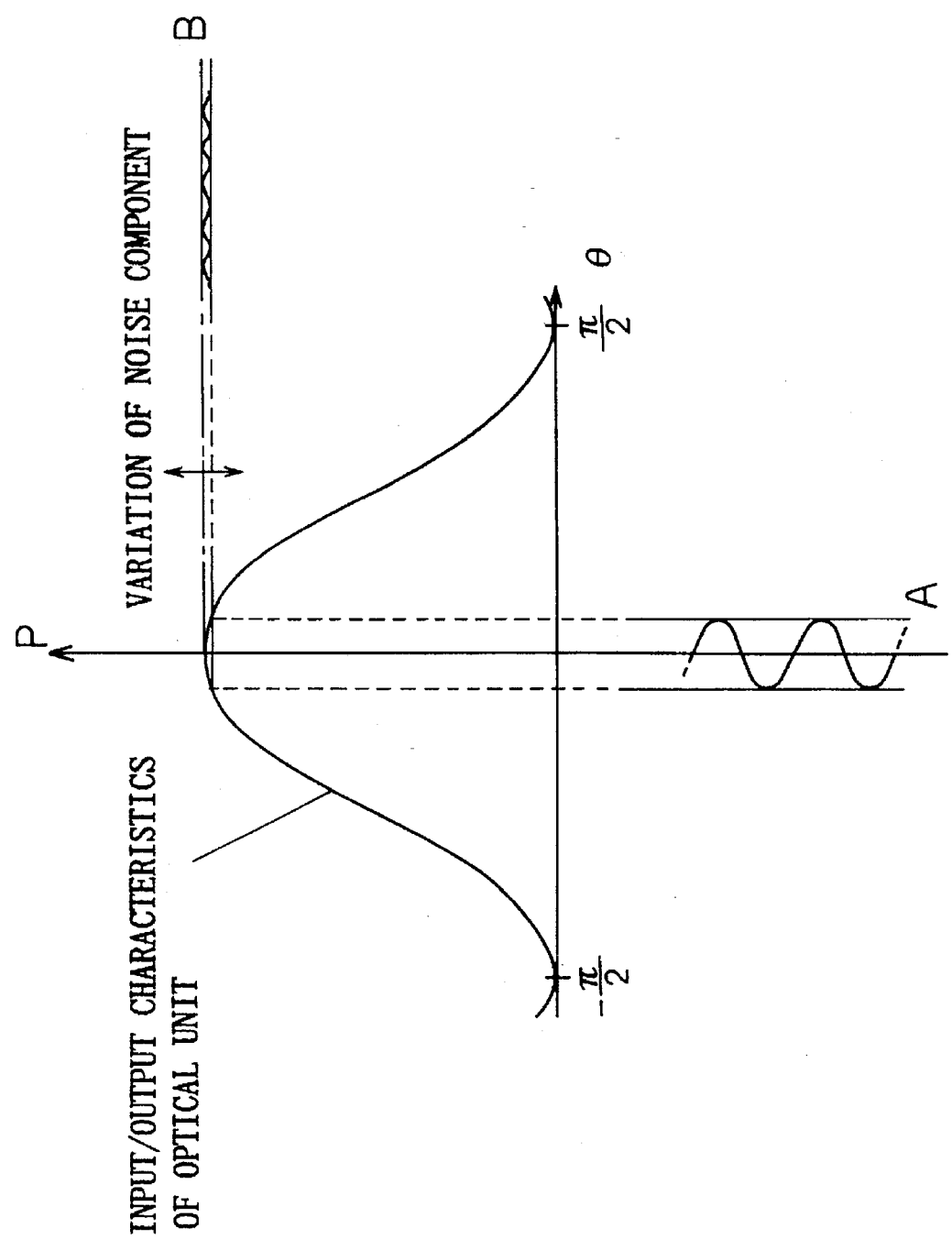
FIG. 11 is a diagram of a input output characteristics of an optical unit in the first embodiment of the invention.

FIG. 11 shows the input/output characteristics of the optical unit (a) in the first embodiment. Provided that the phase difference angle is abscissa and the light output P, the input/output characteristics becomes cosine curve as shown FIG. 11. As the embodiment when the polarization direction of the first and second polarizers is parallel, a non-linear part near the vertex of the characteristics is utilized. On the contrary when the polarization direction of the first and second polarizers is perpendicular, a non-linear part near the base point of the characteristics is utilized. In the embodiments the non-linear part near the vertex of the characteristics is utilized. The optical signal (A) which becomes elliptically polarized light after passing the detection Pockels device 3 and the modulation Pockels device 4, becomes a wave signal B which is distorted accordance with the optical signal (A) because of the operation of the non linear part of the characteristics, after the signal (A) passed through the second polarizer 2.

Here the noise, namely, the variation of the input light rides on in a direction P of the characteristics, and appears as the variation of the vertex of the cosine curve and then the noise component appears in a direction of an amplitude of the wave form of the output signal (B). That is when the intensity of the input light is indicated by p and the light output of the optical unit (a) is indicated by the equation of p×{cos(θm+θs)+1}/2, the noise component appears a variation component of the p.

Then the output wave signal (B) includes a phase modulation component, a frequency modulation component, an amplitude modulation component but a phase demodulation method using cross points to time axis is used for final detection of the physical dimension to be measured. For the phase demodulation a carrier frequency which is to be used at frequency demodulation, is necessary but is not known and therefore such signal a phase of which is sifted by $\pi/2$ from that of the control modulation voltage is added to the output signal (B) as mentioned after. Therefore since the direction of the noise affect is perpendicular to the direction of the phase of the output signal (B), noise affect does not appear in the phase demodulated signal. As a result the voltage to be measured can be detected without any external environment.

In contrast, the operation of the optical unit (a) of the current sensor of the second embodiment is as follows. In FIG. 3, nonpolarized incident light 8 is converted into linearly polarized light 9 by the first polarizer 1. After passing through the detection Faraday device 20, the light is further converted into linearly polarized light which corresponds to the rotation angle θs (=So*sin($\omega_s$t),here So is proportional to the Is) of the detection Faraday device 20. After passing through the modulation Faraday device 21, the light is further converted into linearly polarized light which corresponds to a total rotation angle of θs+θm which is a sum of the rotation angle θm (=Mo*sin($\omega_m$t), here Mo is proportional to the Im) due to the modulation Faraday device 21 and the rotation angle θs due to the detection Faraday device 20. Furthermore, linearly polarized light 12 which has passed through the second polarizer 2 shows a change in intensity of {cos(θm+θs)+1}/2 with respect to the intensity of incident light.

In the case of a Faraday device, a light wave which produces a phase difference is right-handed and left-handed circularly polarized light. Therefore, the rotation angle of a Faraday device and the phase difference angle of a Pockels device are same as mentioned above and then the Faraday device and the Pockels device exhibit as the light wave phase modulation device the same function for linearly polarized input light. Further the $\omega_s$ and $\omega_m$ of the equation concerning with said rotation angle are angular velocity of the detection current 22 and the control modulation current 23 and in the second embodiment the rotation angle θm, θs vibrate with angular velocity $\omega_s$, $\omega_m$ maximum amplitude Mo, So, and the rotation angle θm+θs of linearly polarized light 12 which has passed through the modulation Faraday device 21 vibrates. The fundamental contents, for example, the input/output characteristics of the optical unit (a) or the signal waves are same as those of the first embodiment.

As described above, both in the voltage sensor of the PM modulation type of the first embodiment and the current sensor of the PM modulation type of the second embodiment, the output of the optical unit (a) is indicated by {cos(θm+θs)+1}/2. When the output was subjected to spectrum expansion, the spectrum indicated by the solid lines in FIG. 4 was obtained. In other words, it was found that, in the outputs of the optical units a of the first and second embodiments, a pseudo PM modulation (phase modulation) portion exists at each integer multiples of the angular velocity $\omega_m$ of the control modulation physical dimension. The inventor found that when the pseudo PM modulation portion is utilized, the information of the physical dimension to be measured can be restored. Then such output lacks the carrier signal (at position of spectrum $\omega_m$) as shown by broken line and therefore the physical dimension to be measure can not be restored by only such output. Therefore the below mentioned signal addition operation is necessary.

Figure 4:
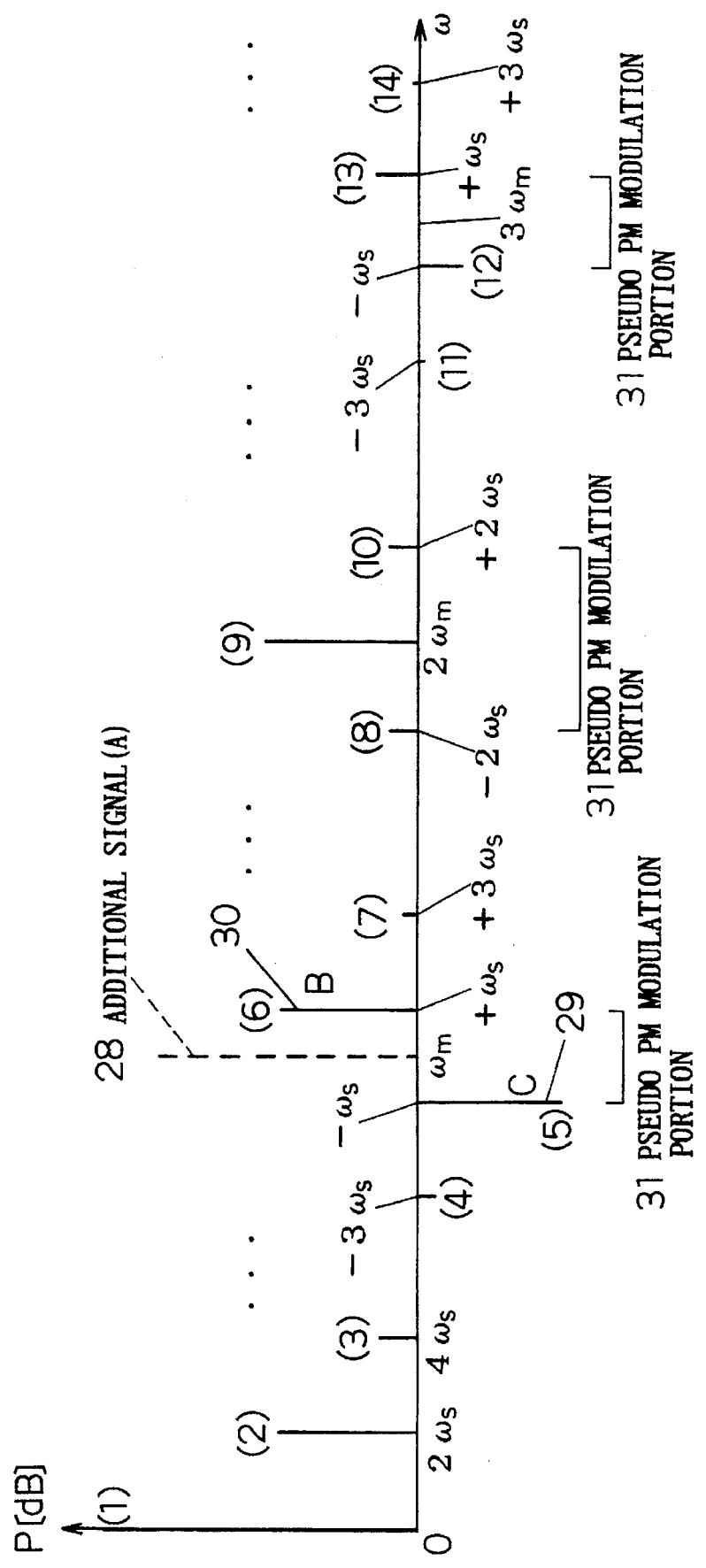
FIG. 4 is a diagram illustrating an output spectrum of an optical unit in the invention.

In FIG. 4, spectrum intensities (1) to (14) are as listed in Table 3 bellow.

These intensities are shown for reference purpose.

TABLE 3

| Correspondence table of spectrum intensity | |
|---|---|
| Number | Spectrum intensity |
| (1) | $\{J_0(S_0)J_0(M_0) + 1\} / 2$ |
| (2) | $J_2(S_0)J_0(M_0)$ |
| (3) | $J_4(S_0)J_0(M_0)$ |
| (4) | $-J_3(S_0)J_1(M_0)$ |
| (5) | $-J_1(S_0)J_1(M_0)$ |
| (6) | $J_1(S_0)J_1(M_0)$ |
| (7) | $J_3(S_0)J_1(M_0)$ |
| (8) | $J_2(S_0)J_2(M_0)$ |
| (9) | $J_0(S_0)J_2(M_0)$ |
| (10) | $J_2(S_0)J_2(M_0)$ |
| (11) | $-J_3(S_0)J_3(M_0)$ |
| (12) | $J_1(S_0)J_3(M_0)$ |
| (13) | $J_1(S_0)J_3(M_0)$ |
| (14) | $J_3(S_0)J_3(M_0)$ |

The symbol $J_i$ indicates the Bessel function (i: an integer).

In the first and second embodiments, an additional signal 28 is added in order to utilize the pseudo PM modulation portion 31 at the angular velocity $\omega_m$. In both the voltage sensor of the first embodiment and the current sensor of the second embodiment, the additional signal 28 is the output (Vm'*sin($\omega_m$t+$\pi/2$)) 25 of the phase shifter 15 and is added to the output of the O/E converter 17. Therefore, the output spectrum of the adder 16 is a sum of the spectrum indicated by solid lines and the broken line in FIG. 4.

Figure 5:
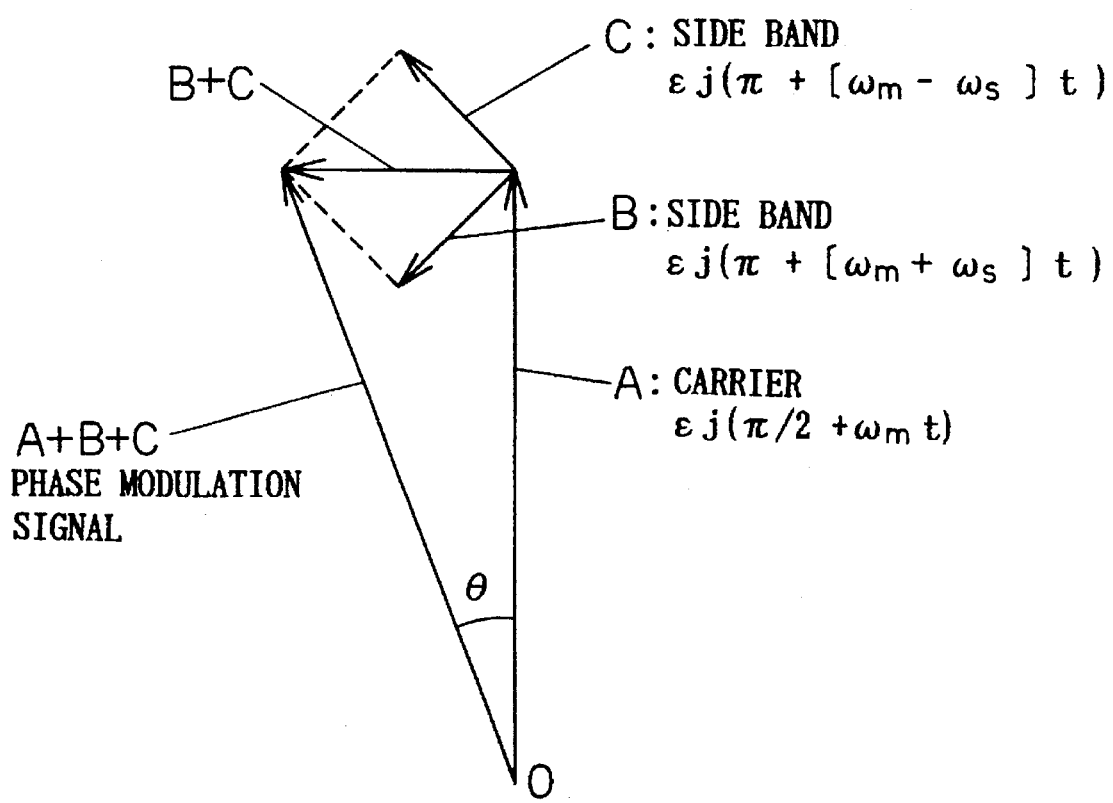
FIG. 5 is a vector diagram illustrating the PM modulation system in the invention.

When the additional signal 28 of the angular velocity $\omega_m$ (the output 25 of the phase shifter 15) is represented as a carrier A as shown in FIG. 5 and side-band spectrum—J1 (So)J1(Mo) 29 of the angular velocity $\omega_m$–$\omega_s$ is represented as as the side band C shown in FIG. 5, and further side-band spectrum J1(So)J1(Mo) 30 of the angular velocity $\omega_m$+$\omega_s$ is represented as the side band B shown in FIG. 5, the vector diagram of the carrier A and the two side bands B and C becomes as shown in FIG. 5. As seen from the diagram, the PM modulation signal consists of A+B+C or conventional PM modulation (phase modulation) is conducted.

When the PM modulation signal is passed through the FM demodulator 18 and the integrator 19, the information of the physical dimension to be measured (the voltage to be measured or the current to be measured) is completely demodulated.

Figure 12:
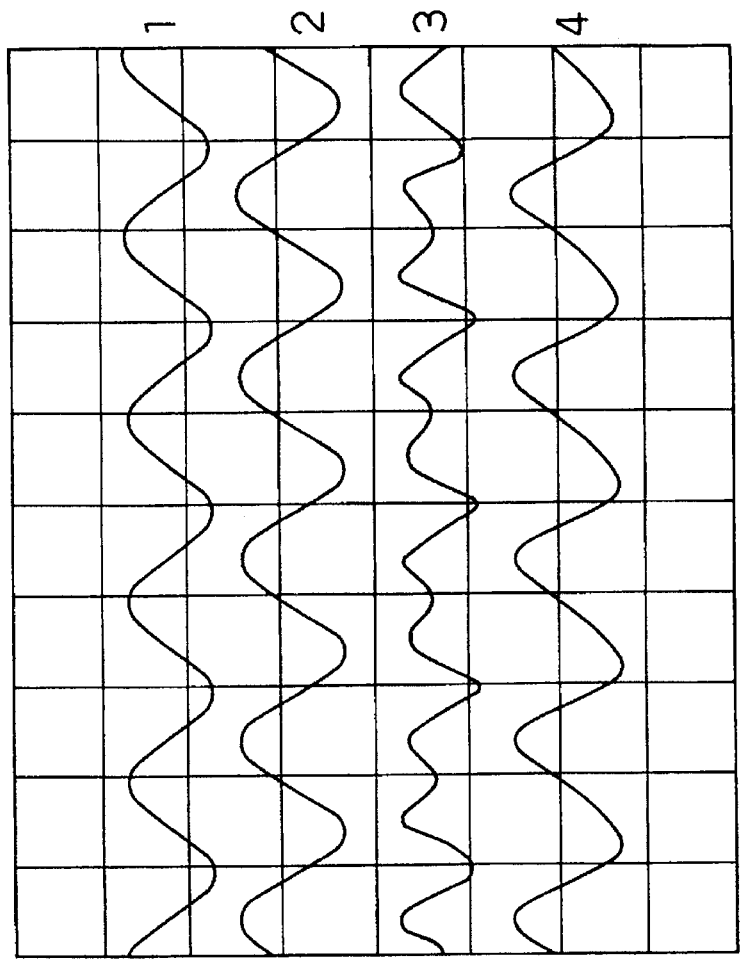
FIG. 12 is a diagram of an example of signal wave forms at each part in the first embodiment of the invention.
Figure 13:
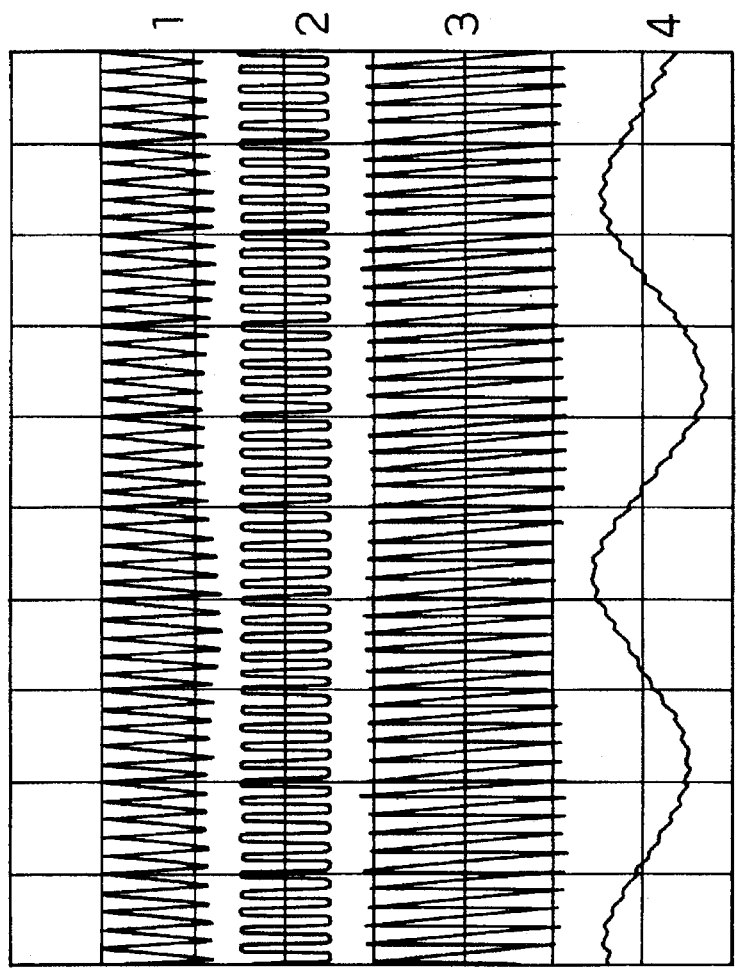
FIG. 13 is a diagram of an example of signal wave forms at each part in the first embodiment of the invention.

FIG. 12 and FIG. 13 show signal wave forms of each part in the first embodiment. In the FIG. 12 a wave form 1 indicates the control modulation voltage of 1 kHz frequency applied to the Pockels device 4, a wave form 2 indicates a signal a phase of which is shifted $\pi/2$ from the phase of the control modulation voltage by the phase shifter 15. A wave form 3 indicates an output signal (electric signal converted by O/E converter) of the optical unit (a), and the wave form 3 is distorted by the non linear part of the input/output characteristics. A wave form 4 indicates a signal which is derived by adding the wave form 2 and wave form 3 by the adder 16 and is applied to the FM demodulator 18. Next in FIG. 13 wave form 1 indicates the wave form 4 of FIG. 12 wherein the time axis of the FIG. 13 is contracted from that of the FIG. 12. A wave form 2 indicates a signal which is processed by a comparater and a wave form 3 indicates a signal which is obtained by converting the frequency of the output of the comparater to a voltage. A wave form 4 of a voltage signal, an integrated value of which is proportional to the voltage to be measured, is obtained by passing the frequency/voltage converted signal through LPF(low pass filter).

As described above, conventional PM modulation is conducted. Therefore, the information of the physical dimension to be measured (the voltage to be measured or the current to be measured) is carried on the time axis of the change in output of the optical sensor, and orthogonal relationships, that is, such relationships where the time and the output P are independent to each other, are established between the information and that of the external environment which is carried on the intensity axis of the change in output light of the optical sensor. As a result, the information of the physical dimension to be measured is not affected by the external environment so that the information of the physical dimension to be measured which ranges from DC to a high frequency can correctly be detected.

THIRD EMBODIMENT

Figure 6:
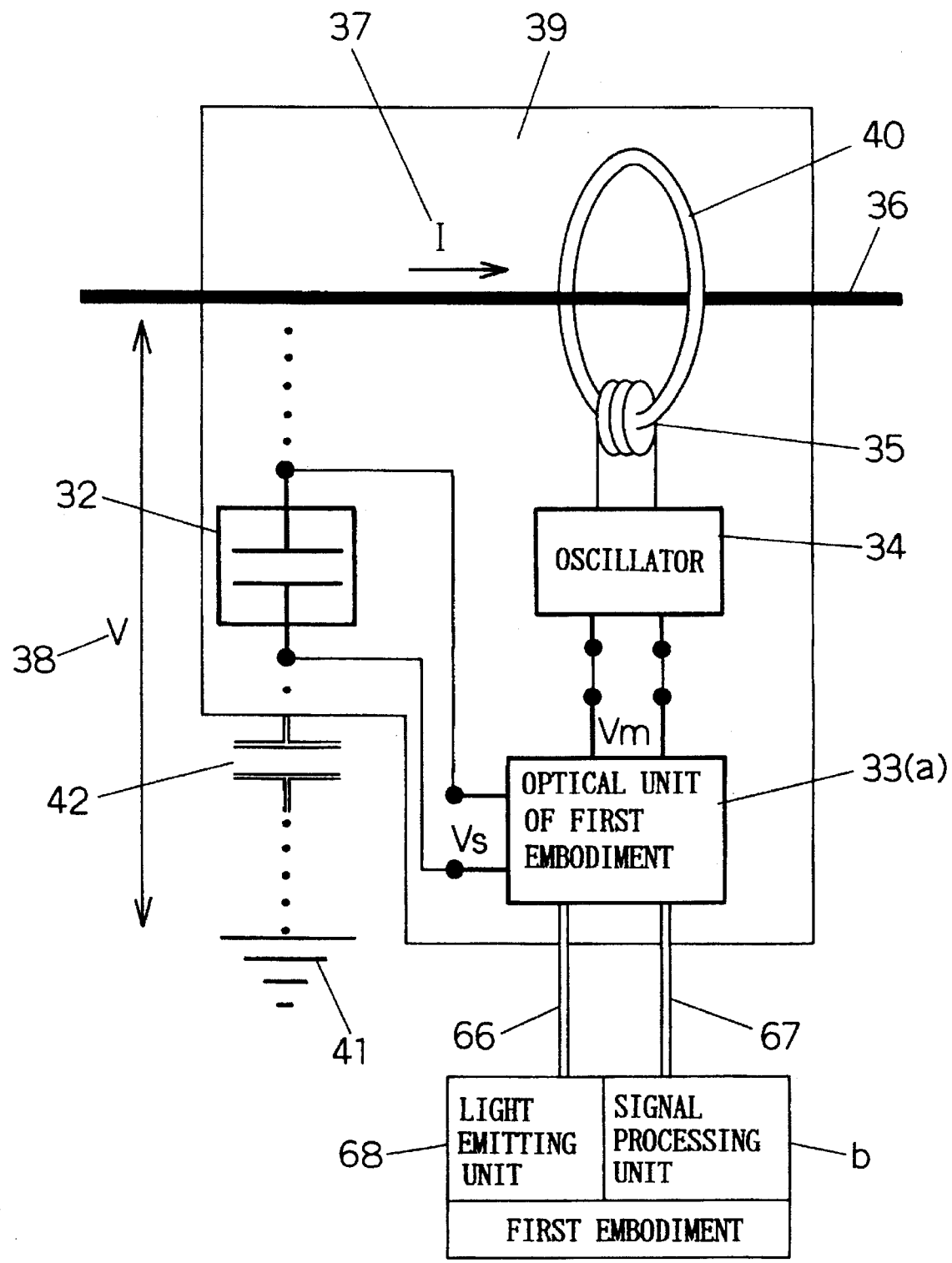
FIG. 6 is a diagram of a voltage sensor of the PM modulation type which is a third embodiment of the invention.

Next, a third embodiment of the invention will be described with reference to FIG. 6. As shown in FIG. 6, the third embodiment uses the voltage sensor of the PM modulation type of the first embodiment and measures the voltage to ground (V) 38 of an electric wire 36.

The third embodiment comprises: an oscillator 34 which is powered by a current (I) 37 of the electric wire to be measured 36 via a CT (current transformer) consisting of a core 40 and a coil 35; a potential divider 32 which divides the voltage to ground 38 of the electric wire 36 with using a floating earth capacity 42; and the voltage sensor of the first embodiment. The core 40, coil 35, oscillator 34, potential divider 32 and the optical unit (a) of the first embodiment within voltage sensor are built-in a weather resistant case 39. The light emitting unit 68 of the voltage sensor and the signal processing unit (b) are provided far from the case 39 and optical fibers 66,67 are used for transmitting light between them. The reference numeral 41 designates the ground. The oscillator 34 generates the control modulation voltage (Vm*sin($\omega_m$t)) 6 which is then applied to the modulation Pockels device 4. The potential divider 32 divides and applies the voltage to be measured (Vs*sin($\omega_s$t)) 5 which is proportional to the voltage to ground 38, to the detection Pockels device 3. The voltage to be measured 5 which has been demodulated by the signal processing unit (b) is multiplied by the proportional coefficient of the potential divider 32 to measure the objective voltage against ground (V) 38.

According to the embodiment, the voltage to ground 38 of the electric wire to be measured 36 can correctly be detected in the range of DC to a high frequency without being affected by the external environment.

FOURTH EMBODIMENT

Figure 7:
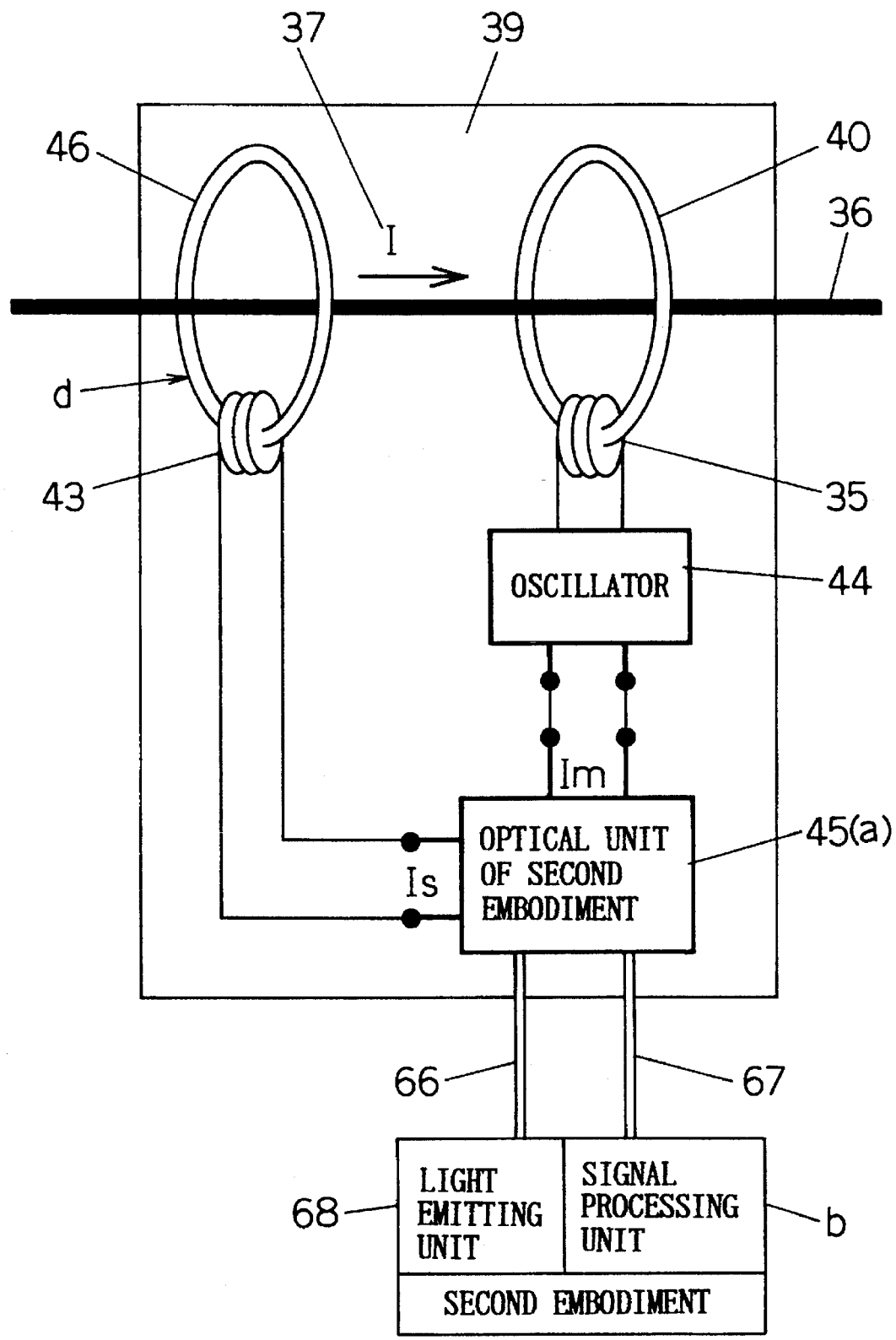
FIG. 7 is a diagram of a current sensor of the PM modulation type which is a fourth embodiment of the invention.
Figure 8:
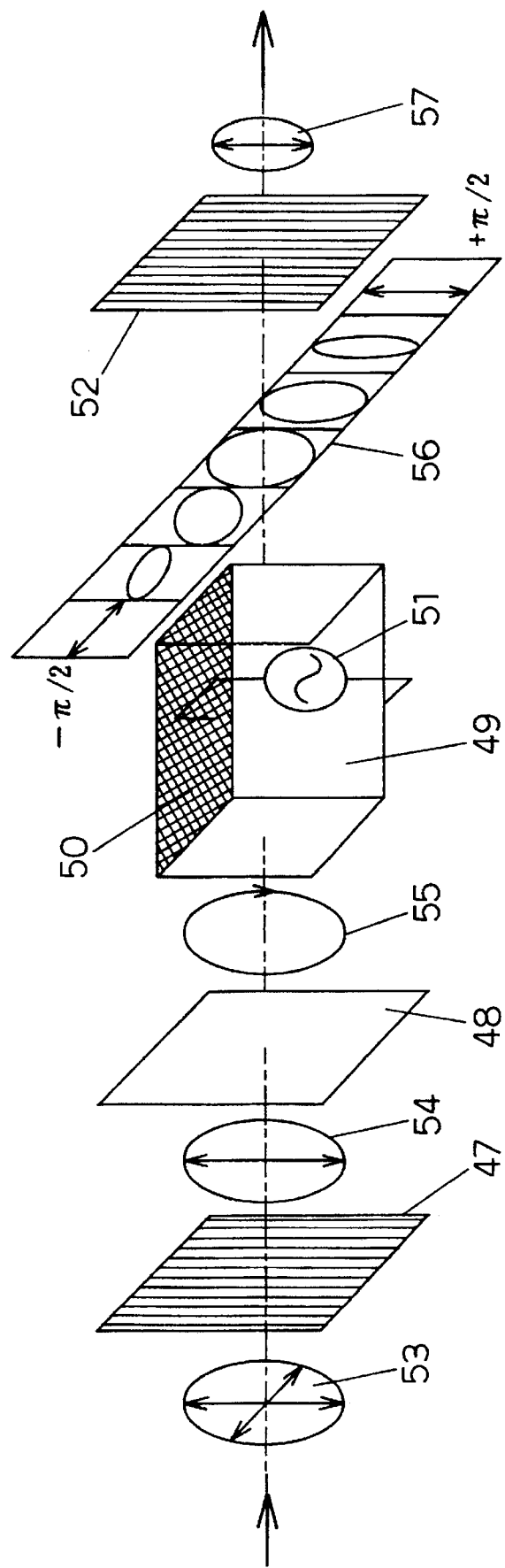
FIG. 8 is a diagram of a voltage sensor of the intensity modulation type which is used in a prior art voltage measurement.
Figure 9:
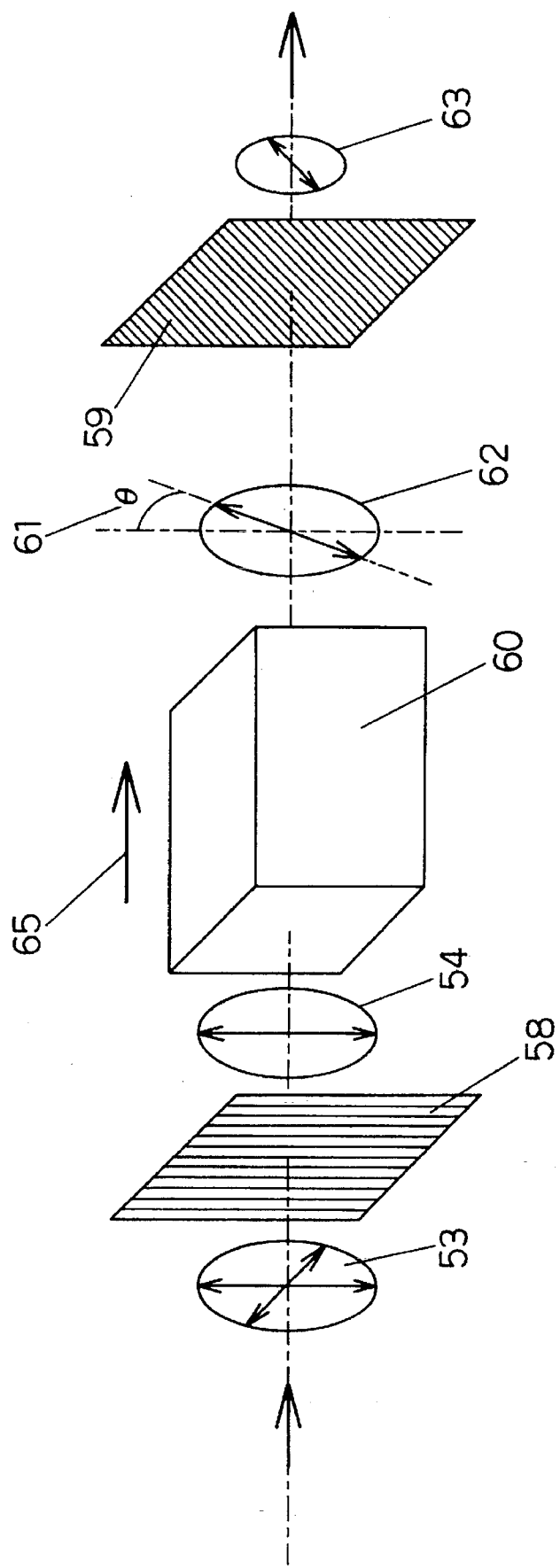
FIG. 9 is a diagram of a current sensor of the intensity modulation type which is used in a prior art current measurement.

A fourth embodiment of the invention will be described with reference to FIG. 7. As shown in FIG. 7, the fourth embodiment uses the current sensor of the PM modulation type of the second embodiment and measures the line current (I) 37 of an electric wire 36.

The fourth embodiment comprises: an oscillator 44 which is powered by the line current 37 of the electric wire to be measured 36 via a CT consisting of a core 40 and a coil 35; an auxiliary unit (d) which applies a magnetic field proportional to the line current 37 of the electric wire to be measured 36, to the detection Faraday device 20 via an auxiliary core 46 and an auxiliary coil 43; and the current sensor of the second embodiment and the core 40, the coil 35, the oscillator 44, the auxiliary unit (d), and the optical unit (a) of the second embodiment within current sensor are integrated by a weather resistant case 39. But the light emitting unit 68 and the signal processing unit (b) are remotely placed. The light transmission is conducted through optical fibers 66 and 67. The oscillator 44 generates the control modulation current (Im*sin($\omega_m$t)) 23 which is then applied to the modulation Faraday device 21. The auxiliary unit d applies the magnetic field which is proportional to the current to be measured (Is*sin($\omega_s$t)) 22 (37), to the detection Faraday device 20. The demodulated magnetic field by the signal processing unit (b) is multiplied by the proportional coefficient of the auxiliary unit (d) to measure the objective line current (I) 37.

According to the embodiment, the line current 37 flowing through the electric wire to be measured 36 can correctly be detected in the range of DC to a high frequency without being affected by the external environment.

FIFTH EMBODIMENT

Figure 10:
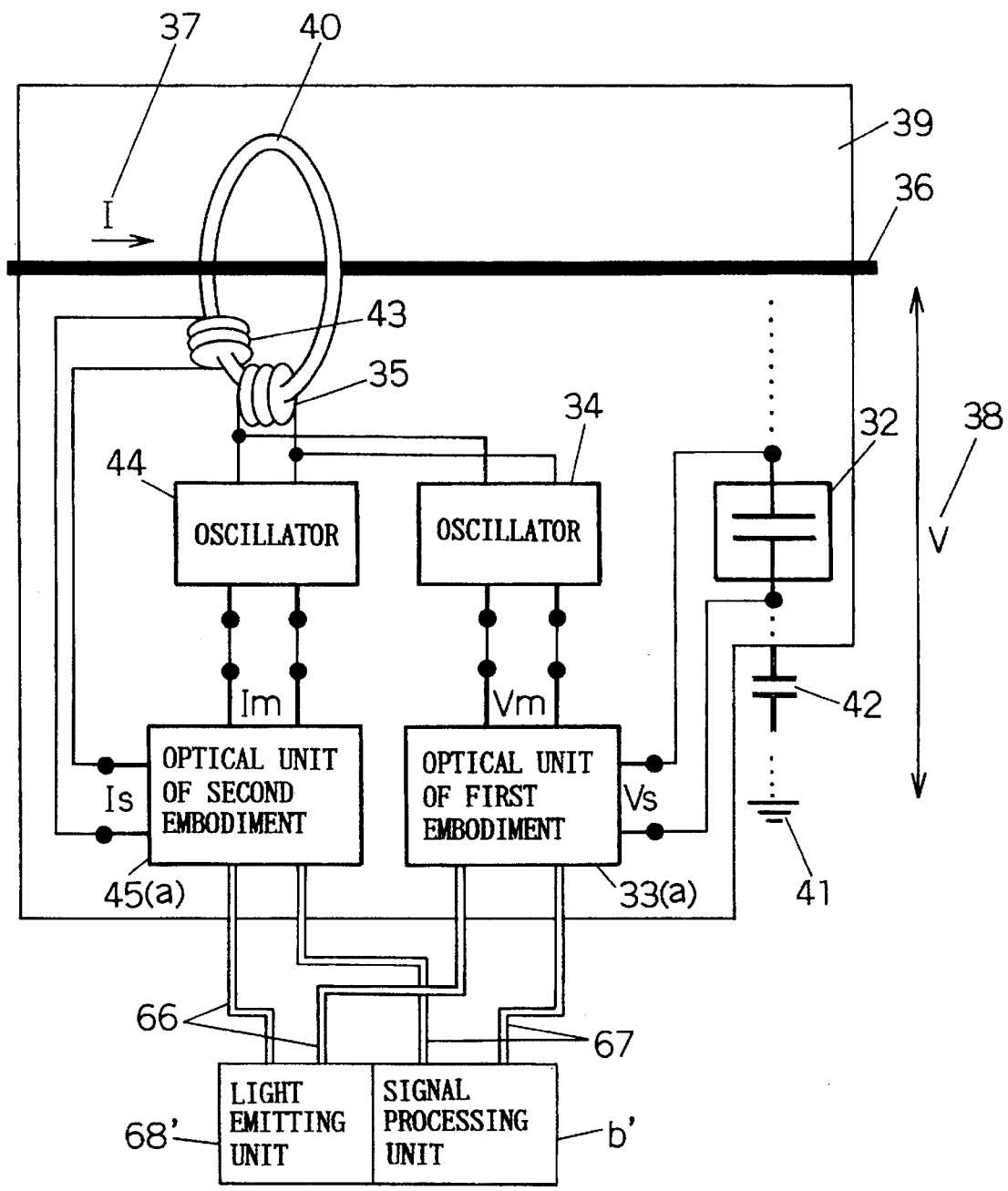
FIG. 10 is a diagram of a voltage and current sensor of the PM modulation type which is a fifth embodiment of the invention.

As shown in FIG. 10 when the optical sensor for voltage detection of the third embodiment and the optical sensor for current detection of the fourth embodiment are integrated into one body and attached to an electric line 36, the voltage 38 to ground and line current 37 can be simultaneously detected. That is in a weather resistant case 39, the optical unit (a) 33 of the voltage sensor of the first embodiment, the optical unit (a) 45 of the current sensor of the second embodiment, the oscillator 34 generating the control modulation voltage Vm, the oscillator 44 generating the current modulation voltage Im, the potential divider 32, and the core 40 having the coils 35,43. Further the light emitting unit 68' and a signal processing unit (b') are provided at a remote position from the case 39. Between them two optical fibers 66,67 are connected respectively. Here the core 40 of CT are one piece and the coil 35 for supplying source and the coil 43 for detecting current are winded around the core 40. The light emitting unit 68' and a signal processing unit (b') can process two kinds of signal. Here when the oscillator 34,44 can generate tow kinds of signal, they can be integrated into one body. Further instead of the optical fibers 66,67 such one optical fiber having four cores can be used. The constitution of FIG. 10 is one example and therefore special CT can be used for current detection and the signal processing unit for voltage and the signal processing unit for current can be separately used. By using the optical sensor of the embodiment, the voltage to ground and the line current of electric distribution line can be simultaneously detected, thereby to easily find a trouble such as ground fault or short circuit of the line.

SIXTH EMBODIMENT

The invention can be executed while replacing at least one of the detection Pockels device 3 and the modulation Pockels device 4 in the first embodiment with a plurality of Pockels devices. Also in the resulting optical sensor, the same effects as those described above can be attained. An optical sensor may be configured while replacing at least one of the detection Faraday device 20 and the modulation Faraday device 21 in the second embodiment with a plurality of Faraday devices. Also in the optical sensor, the same effects as those described above can be attained.

SEVENTH EMBODIMENT

In the first or second embodiment, an integrator 10 (shown by dotted line in FIG. 1 and FIG. 2) is disposed at a portion P or Q so that time-integration is conducted on the voltage to be measured ($Vs*\sin(\omega_s t)$) 5 or the current to be measured ($Is*\sin(\omega_s t)$) 22. In the embodiment, unlike the above-described embodiments in which phase modulation is conducted, the voltage or current to be measured can correctly be detected on the basis of a change in frequency of the carrier of modulated light. In other words, based on a change in frequency (FM modulation), the information of the voltage or current to be measured can be carried on the time axis of the change in output of the optical sensor, so that orthogonal relationships are established between the information of the physical dimension to be measured and that of the external environment which is carried on the intensity axis of the change in output of the optical sensor. Consequently, the information of the physical dimension to be measured is not affected by the external environment so that the information of the physical dimension to be measured which ranges from DC to a high frequency can correctly be detected.

In this way, by applying a voltage which is in proportion to a value obtained by time-integrating the voltage to be measured, to the detection Pockels device 3 or by applying a current which is in proportion to a value obtained by time-integrated the current to be measured, to the detection Faraday device 20, the demodulator c in the signal processing unit (b) can be consisted only of the FM demodulator 18 and can omit the integrator 19.

EIGHTH EMBODIMENT

The invention can be executed while the detection Pockels device 3 and the voltage to be measured 5 in the first embodiment are positionally interchanged with the modulation Pockels device 4 and the control modulation voltage 6, that is, the order on the optical axis can be changed to get same effect as the above embodiment. Alternatively, the invention may be executed while the detection Faraday device 20 and the current to be measured 22 in the second embodiment are positionally interchanged with the modulation Faraday device 21 and the control modulation current 23. Also in these optical sensors, the same effects as those described above can be attained.

The positional order of the detection Pockels device 3 and the modulation Pockels device 4 in the optical path can be determined arbitrarily in the first embodiment. This is applicable also to the Faraday device 20 and the modulation Faraday device 21 in the second embodiment.

NINTH EMBODIMENT

In the voltage sensor of the first embodiment, in some cases such as where the voltage to be measured 5 is remotely located, or where the first polarizer 1, the detection Pockels device 3, the modulation Pockels device 4, or the second polarizer 2 is incorporated into an apparatus, the first polarizer 1, the detection Pockels device 3, the modulation Pockels device 4, and the second polarizer 2 may not be arranged on the same optical axis. In such cases, an optical transmission line which does not change the polarization state, such as a polarization-preserving fiber may be used to connect two successive ones of the first polarizer 1, the detection Pockels device 3, the modulation Pockels device 4, and the second polarizer 2, when the distance between the two components is large or separated from the optical axis. This is applicable also to the current sensor of the second embodiment (in this case, "Pockels devices" are read as "Faraday devices").

As described above, the use of a polarization preserving fiber can attain the same effects as those described above even when the physical dimension to be measured is remotely located, or when physical restrictions compel the optical axes of the components not to be coincident with each other.

In summary, when a physical dimension such as a voltage or current to be measured is measured on the basis of a change of the carrier of modulated light in the direction of the time axis, i.e., a change in phase (PM modulation) or that in frequency (FM modulation), the voltage or current to be measured can accurately be measured without being affected by a change in coupling loss of optical components and that in light intensity due to the external environment which produce problems in a prior art optical sensor of the amplitude modulation type and which are fundamental problems in the field of an optical transmission line. Furthermore, information which is other than that of the physical dimension to be measured and which may cause disturbance is prevented from entering a change in phase or frequency. Therefore, it is not required to consider distinguishment of the voltage or current to be measured from other external influences which may produce problems in a measurement of a voltage in the vicinity of DC that is shown in the prior art example and conducted on the basis of a change in intensity as shown in the prior art example. Consequently, a voltage or current can be measured by a method which is commonly employed in the range of DC to AC.

The invention includes also embodiments in which some of the embodiments described above are combined with each other.

Here bulk type device is used as the light wave phase modulation device in the above mentioned embodiments but optical waveguide type device can be used.

When the voltage sensor using the Pockels device is used, the electrodes of the first and second light wave phase modulation device can be separately provided in an optical axis direction on the surface of one electrooptic crystal, thereby to form integrally the first and second light wave phase modulation device. In such case the constitution can be simple and an adjustment of the optical axis of the two light wave phase modulation device is not necessary at assembling process.

Further in the above embodiments current or voltage is used as the physical dimension but other dimension, namely, phone, light can be used.

What is claimed is:

1. An optical sensor comprising an optical unit and a signal processing unit, wherein said optical unit has on an optical axis;

a first polarizer which is arranged at a light input side, a second polarizer which is arranged at a light output side, the polarization direction of which is substantially parallel or perpendicular to that of said first polarizer, a first light wave phase modulator which are arranged between the first and second polarizers, for phase-modulating light wave according to physical dimension to be measured, a second light wave phase modulator which are arranged between the first and second polarizers, for phase-modulating light wave according to a control modulation physical dimension which has higher frequency of that of the physical dimension to be measured, and said first and second light wave phase modulators being arranged in a manner that directions of light wave phase modulation in said modulators are parallel or perpendicular to each other, and said signal processing unit has;

an O/E converter which converts intensity of light of said optical unit into an electric signal, a phase shifter which shifts a phase of said control modulation physical dimension applied to said second light wave phase modulator by $\pi \times n \pm \pi/2$ radians (n: an integer), an adder which adds an output of said O/E converter to an output of said phase shifter, and a demodulator which demodulates an output of said adder.

2. An optical sensor comprising an optical unit and a signal processing unit, wherein said optical unit has on an optical axis;

a first polarizer which is arranged at a light input side, a second polarizer which is arranged at a light output side, the polarization direction of which is substantially parallel or perpendicular to that of said first polarizer, a first light wave phase modulator which are arranged between the first and second polarizers, for phase-modulating light wave according to a value which is obtained by time-integrating a physical dimension to be measured, a second light wave phase modulator which are arranged between the first and second polarizers, for phase-modulating light wave according to a control modulation physical dimension which has higher frequency of that of the physical dimension to be measured, and said first and second light wave phase modulators being arranged in a manner that directions of light wave phase modulation in said modulators are parallel or perpendicular to each other, and said signal processing unit has;

an O/E converter which converts intensity of light of said optical unit into an electric signal, a phase shifter which shifts a phase of said control modulation physical dimension applied to said second light wave phase modulator by $\pi \times n \pm \pi/2$ radians (n: an integer), an adder which adds an output of said O/E converter to an output of said phase shifter, and a demodulator which demodulates an output of said adder.

3. The optical sensor according to claim 1, wherein said sensor uses an optical transmission line which preserves a polarization state of light between at least one pair of components, said components including said first polarizer, said first light wave phase modulator, said second light wave phase modulator, and said second polarizer.

4. The optical sensor according to claim 2, wherein said sensor uses an optical transmission line which preserves a polarization state of light between at least one pair of components, said components including said first polarizer, said first light wave phase modulator, said second light wave phase modulator, and said second polarizer.

5. The optical sensor according to claim 1, wherein at least one of said first and second light wave phase modulators has a plurality of light wave phase modulating means.

6. The optical sensor according to claim 2, wherein at least one of said first and second light wave phase modulators has a plurality of light wave phase modulating means.

7. The optical sensor according to claim 3, wherein at least one of said first and second light wave phase modulators has a plurality of light wave phase modulating means.

8. The optical sensor according to claim 4, wherein at least one of said first and second light wave phase modulators has a plurality of light wave phase modulating means.

9. The optical sensor according to claim 1, wherein electrodes of the first and second light wave phase modulation are separately formed on a surface of one electrooptic crystal.

10. The optical sensor according to claim 2, wherein electrodes of the first and second light wave phase modulation are separately formed on a surface of one electrooptic crystal.

11. The optical sensor according to claim 3, wherein electrodes of the first and second light wave phase modulation are separately formed on a surface of one electrooptic crystal.

12. The optical sensor according to claim 4, wherein electrodes of the first and second light wave phase modulation are separately formed on a surface of one electrooptic crystal.

13. An optical sensor according to claim 1, wherein said sensor further comprises:

an oscillator which is powered by a current flowing through an electric wire to be measured and oscillates a signal for obtaining said control modulation physical dimension; and a potential divider which divides a voltage between a ground and said electric wire to be measured for obtaining said physical dimension to be measured.

14. An optical sensor according to claim 2, wherein said sensor further comprises:

an oscillator which is powered by a current flowing through an electric wire to be measured and oscillates a signal for obtaining said control modulation physical dimension; and a potential divider which divides a voltage between a ground and said electric wire to be measured for obtaining said physical dimension to be measured.

15. An optical sensor according to claim 3, wherein said sensor further comprises:

an oscillator which is powered by a current flowing through an electric wire to be measured and oscillates a signal for obtaining said control modulation physical dimension; and a potential divider which divides a voltage between a ground and said electric wire to be measured for obtaining said physical dimension to be measured.

16. An optical sensor according to claim 4, wherein said sensor further comprises: an oscillator which is powered by a current flowing through an electric wire to be measured and oscillates a signal for obtaining said control modulation physical dimension; and a potential divider which divides a voltage between a ground and said electric wire to be measured for obtaining said physical dimension to be measured.

17. An optical sensor according to claim 5, wherein said sensor further comprises:

an oscillator which is powered by a current flowing through an electric wire to be measured and oscillates a signal for obtaining said control modulation physical dimension; and a potential divider which divides a voltage between a ground and said electric wire to be measured for obtaining said physical dimension to be measured.

18. An optical sensor according to claim 6, wherein said sensor further comprises:

an oscillator which is powered by a current flowing through an electric wire to be measured and oscillates a signal for obtaining said control modulation physical dimension; and a potential divider which divides a voltage between a ground and said electric wire to be measured for obtaining said physical dimension to be measured.

19. The optical sensor according to claim 1, wherein said sensor further comprises:

an oscillator which is powered by a current flowing through an electric wire to be measured and oscillates a signal for obtaining said control modulation physical dimension; and an auxiliary unit which gets a current to be measured of an electric wire to be measured for obtaining said physical dimension to be measured.

20. The optical sensor according to claim 2, wherein said sensor further comprises:

an oscillator which is powered by a current flowing through an electric wire to be measured and oscillates a signal for obtaining said control modulation physical dimension; and an auxiliary unit which gets a current to be measured of an electric wire to be measured for obtaining said physical dimension to be measured.

21. The optical sensor according to claim 3, wherein said sensor further comprises:

an oscillator which is powered by a current flowing through an electric wire to be measured and oscillates a signal for obtaining said control modulation physical dimension; and an auxiliary unit which gets a current to be measured of an electric wire to be measured for obtaining said physical dimension to be measured.

22. The optical sensor according to claim 4, wherein said sensor further comprises:

an oscillator which is powered by a current flowing through an electric wire to be measured and oscillates a signal for obtaining said control modulation physical dimension; and an auxiliary unit which gets a current to be measured of an electric wire to be measured for obtaining said physical dimension to be measured.

23. The optical sensor according to claim 5, wherein said sensor further comprises:

an oscillator which is powered by a current flowing through an electric wire to be measured and oscillates a signal for obtaining said control modulation physical dimension; and an auxiliary unit which gets a current to be measured of an electric wire to be measured for obtaining said physical dimension to be measured.

24. The optical sensor according to claim 6, wherein said sensor further comprises:

an oscillator which is powered by a current flowing through an electric wire to be measured and oscillates a signal for obtaining said control modulation physical dimension; and an auxiliary unit which gets a current to be measured of an electric wire to be measured for obtaining said physical dimension to be measured.

25. An optical sensor comprising an optical unit and a signal processing unit, wherein said optical unit has on an optical axis;

a first polarizer which is arranged at a light input side, a second polarizer which is arranged at a light output side, the polarization direction of which is substantially parallel or perpendicular to that of said first polarizer, a first light wave phase modulator which are arranged between the first and second polarizers, for phase-modulating light wave according to physical dimension to be measured, a second light wave phase modulator which are arranged between the first and second polarizers, for phase-modulating light wave according to a control modulation physical dimension which has higher frequency of that of the physical dimension to be measured, and said first and second light wave phase modulators being arranged in a manner that directions of light wave phase modulation in said modulators are parallel or perpendicular to each other, and said signal processing unit has;

an O/E converter which converts intensity of light of said optical unit into an electric signal, a phase shifter which shifts a phase of said control modulation physical dimension applied to said second light wave phase modulator by $\pi \times n + \pi/2$ radians (n: an integer), an adder which adds an output of said O/E converter to an output of said phase shifter, and a demodulator which demodulates an output of said adder, and wherein said sensor further comprises:

an oscillator which is powered by a current flowing through an electric wire to be measured and oscillates a signal for obtaining said control modulation physical dimension; and a potential divider which divides a voltage between a ground and said electric wire to be measured for obtaining said physical dimension to be measured, and said sensor further comprises:

an auxiliary unit which gets a current to be measured of an electric wire to be measured for obtaining said physical dimension to be measured, and further said physical dimension to be measured is a voltage and a current of an electric wire to be measured, thereby to simultaneously measure said voltage and said current.

* * * * *